United States Patent [19]

Lauffer et al.

[11] Patent Number: 4,656,375
[45] Date of Patent: Apr. 7, 1987

[54] TEMPERATURE COMPENSATED CMOS TO ECL TRANSLATOR

[75] Inventors: Donald K. Lauffer, Poway; Ikuo J. Sanwo, San Marcos, both of Calif.

[73] Assignee: NCR Corporation, Dayton, Ohio

[21] Appl. No.: 809,108

[22] Filed: Dec. 16, 1985

[51] Int. Cl.$^4$ ............................................. H03K 17/14
[52] U.S. Cl. .................................... 307/475; 307/443; 307/446; 307/297; 307/310
[58] Field of Search .............. 307/443, 446, 451, 455, 307/475, 491, 495, 570, 264, 297, 310; 323/313

[56] References Cited

U.S. PATENT DOCUMENTS

| 4,220,877 | 9/1980 | Giordano | 307/310 |
|---|---|---|---|
| 4,472,647 | 9/1984 | Allgood et al. | 307/475 |
| 4,477,737 | 10/1984 | Ulmer et al. | 307/297 |
| 4,488,064 | 12/1984 | Vance | 307/443 X |
| 4,527,078 | 7/1985 | Smith | 307/443 X |
| 4,540,900 | 9/1985 | Early et al. | 307/445 X |
| 4,620,115 | 10/1986 | Lee et al. | 307/475 X |

OTHER PUBLICATIONS

Gersbach, "Voltage Level Translation Circuit", IBM T.D.B., vol. 18, No. 1, Jun. 1975, pp. 71-72.

Primary Examiner—Stanley D. Miller
Assistant Examiner—D. R. Hudspeth
Attorney, Agent, or Firm—Wilbert Hawk, Jr.; Edward Dugas

[57] ABSTRACT

The present invention is a temperature compensating circuit adapted for use with a CMOS to ECL interfacing circuit which uses one normally unused ECL logic gate, formed on a chip of many ECL logic gates for generating the supply voltages for the level interfacing circuit such that the output voltage levels from the interfacing circuit will automatically track with the temperature experienced by the chips' ECL logic gates.

10 Claims, 2 Drawing Figures

| TYPICAL VOLTAGE CONDITIONS | | | | | | | | |
|---|---|---|---|---|---|---|---|---|
| VIH | VIL | VOH | VOL | VSS | VA | VB | VEE | VCC |
| G | -3.3 | -0.8 | -1.6 | -3.3 | -0.8 | -1.6 | -5.2 | G |

TEMPERATURE COMPENSATED CMOS TO ECL TRANSLATOR

BACKGROUND OF THE INVENTION

The subject matter of the present invention relates generally to circuitry for converting CMOS logic levels to corresponding ECL logic levels to permit the coupling of CMOS circuits to ECL circuits and to a means for temperature compensating such circuitry.

To couple a CMOS circuit to an ECL circuit the difference between the output voltages from the one circuit and the input voltages needed by the second circuit must be generated by some form of interfacing circuit. A CMOS circuit's logic level "1" will approach the power supply value, generally 3 volts, while its logic level "0" will be near the reference or ground level. On the other hand, an ECL circuit's logic level "1" will approach −0.8 volts while its logic level "0" will approach −1.68 volts. If the interfacing circuit derives its power from the CMOS circuit the difference in temperature between the CMOS and the ECL circuit can cause a variance in the response level of the ECL circuit due to the shifts in electrical characteristics as a function of temperature. In order to minimize and/or to totally eliminate the temperature sensitivity of the interfacing circuit it would be preferable to have a means for temperature compensating the interfacing circuit to the ECL circuit such that the output from the interfacing circuit fluctuates in the same and/or similar manner as the sensitivity of the input(s) to the ECL circuits.

Circuitry for performing an interfacing function is shown in U.S. Pat. No. 4,486,671, entitled "Voltage Level Shifting Circuit", by Daniel Ong. The circuit described in that patent is a voltage level shifting circuit that is suitable as an interface circuit between TTL and CMOS circuitry.

Another patent of interest is U.S. Pat. No. 4,486,670, entitled "Monolithic CMOS Low Power Digital Level Shifter", by Yiu-Fai Chan et al. The circuit of that patent provides a power level shift which converts the typical transistor logic levels, for example, typically 5 volts to a higher voltage, approximately 20 volts, in order to program an EPROM.

Another patent of interest is U.S. Pat. No. 4,453,095, entitled "ECL MOS Buffer Circuits", by R. S. Wrathall. The circuit of that patent is a buffer circuit for interfacing CMOS circuitry with associated ECL devices. One relevant interfacing inverter circuit is shown, for example, in FIG. 1B.

In U.S. Pat. No. 3,716,722 entitled "Temperature Compensation for Logic Circuits," by R. W. Bryant et al., there is disclosed a temperature compensating circuit for ECL circuits mounted on a single chip or on different chips connected to each other.

In U.S. Pat. No. 3,806,736 entitled "Temperature Compensated Emitter Coupled Logic Circuit," by W. Wilhelm, there is disclosed a temperature compensated ECL circuit incorporating a differential amplifier.

In U.S. Pat. No. 4,461,992 entitled "Temperature-Compensated Current Source Circuit and a Reference Voltage Generating Circuit Using the Same," by K. Y. Sayama et al., there is disclosed a circuit which combines the current flow from a positive temperature dependent path with the current flow from a negative temperature dependent path to substantially cancel the effects of temperature.

In U.S. Pat. No. 4,533,842 entitled "Temperature Compensated TTL to ECL Translator," by T-S Yang et al., there is disclosed a level translator for converting TTL logic levels to ECL logic levels incorporating a temperature compensating circuit which selects resistor ratios so as to offset negative temperature coefficients with positive temperature coefficients thereby nulling the effect of temperature on the circuit.

SUMMARMY OF THE INVENTION

It is a principal object of the present invention to provide an improved CMOS to ECL interface circuit having a temperature compensating feature.

In a preferred circuit embodiment of the invention there is provided a complementary switching circuit for switching an output terminal between two voltage levels corresponding to the logic levels of an ECL logic circuit. A normally unused ECL logic circuit, mounted or formed as part of an integrated circuit chip, provides the two voltage levels to the complementary switch such that temperature variations experienced by the ECL circuit are reflected in the voltage levels applied to the complementary switch so as to compensate the ECL logic output levels from the complementary switch.

The aforementioned object and other features of the present invention will become more apparent when taken in conjunction with the following description and drawings wherein like characters indicate like parts and which drawings form a part of the present specification.

DESCRIPTION OF THE PREFERRED EMBODIMENT

Figures 1, 2:
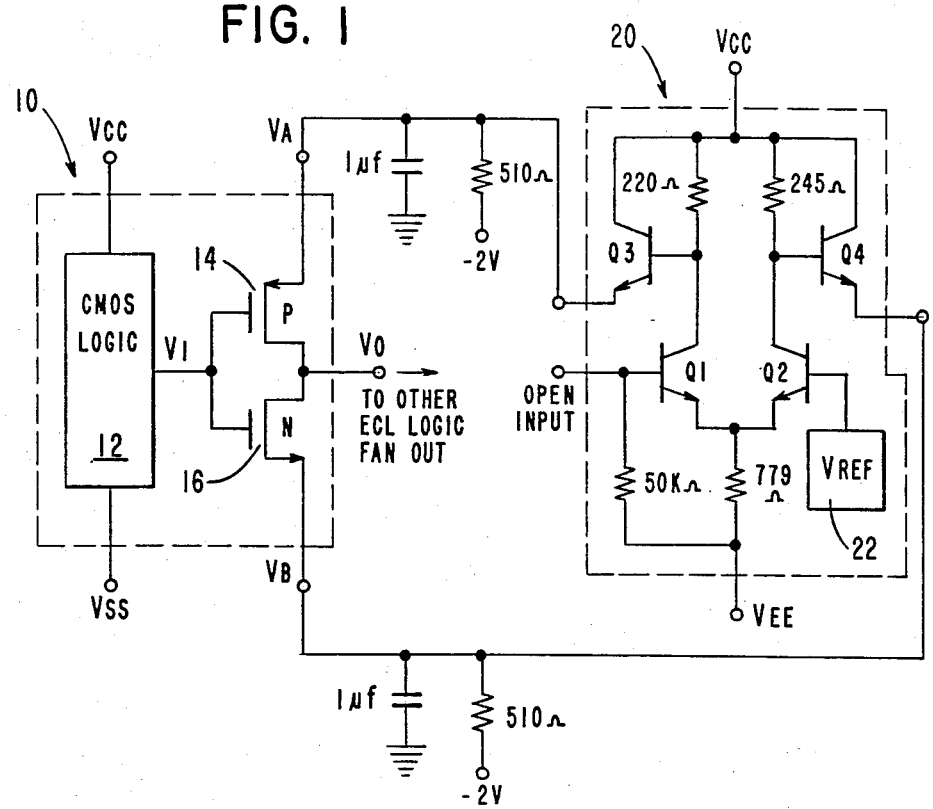
FIG. 1 is a circuit diagram of the preferred embodiment of the invention.
FIG. 2 is a table indicating the typical voltage conditions present at like labeled parts of the circuit of FIG. 1.

Referring to FIG. 1, a CMOS logic device 10 is adapted to be connected to service ECL logic devices in a fan out fashion via an output terminal $V_0$. A CMOS logic circuit 12 is connected between a reference potential VCC and a supply voltage VSS to provide at its output a CMOS logic level signal denoted V1, which signal has two logic states with voltage levels of 0 volts and −3.3 volts, respectively. An interfacing circuit, comprised of transistors 14 and 16, which may be formed using discrete devices or as part of the CMOS logic device 10 receives the signal V1 and translates the signal to corresponding ECL logic level signals. The signal V1 is coupled to the gate of transistors 14 and 16 which transistors are connected between a pair of supply voltage terminals VA and VB.

In order to drive an ECL logic circuit the voltages appearing on the terminal $V_0$ should, for the two logic states, have the values of −0.8 volts and −1.6 volts corresponding to the ECL "high" and "low" logic levels. The two voltages may be generated either by a supplemental power supply associated either with the CMOS logic device or the serviced ECL devices, or by a power supply which is totally independent of the CMOS and ECL devices. Because the voltage responses of the serviced ECL logic devices, coupled to the output $V_0$, vary somewhat as a function of temperature it is most desirable to have the voltages representing the logic levels vary in a directly proportional manner with the voltage responses of the serviced ECL logic circuits. As previously explained, this is accomplished by using one of the unused ECL logic gates that is exposed to the same temperature environment as the other ECL logic gates serviced by the CMOS device 10.

Although various logic gates may be utilized to accomplish the same function, namely that of providing an output voltage which varies as a direct function of temperature, one NOR gate of the type manufactured by Motorola, Inc. under their part number MC10101 is shown in the preferred exemplary embodiment. In the preferred embodiment, the NOR gate is provided with a reference (ground) terminal VCC and a terminal VEE for receiving a −5.2 volt supply voltage. Four transistors of the NPN type, labeled Q1 through Q4, form the NOR gate and are connected such that the emitter of Q3 which is the NOR output, is connected to the terminal VA with the emitter of Q4 which is the OR output, being connected to the terminal VB. The emitters of transistors Q1 and Q2 are connected by means of a 779 ohm resistor to the VEE supply. A reference potential source 22, having a value of −1.3 volts, is connected to the base of transistor Q2. The base of transistor Q1 is connected by means of a 50 K ohm resistor to the terminal VEE. A 220 ohm biasing resistor connects the collector and base of transistor Q1 and Q3, respectively, to the reference potential VCC. In a like manner a biasing resistor of 245 ohms connects the base of transistor Q4 and the collector of transistor Q2 to the reference potential VCC.

In operation, the transistor Q3 is biased ON with a one diode voltage drop appearing between its base and its emitter which thereby places a voltage of approximately −0.8 volts at the terminal VA. The base of transistor Q1 is held opened and is connected by a 50 K ohm resistor to the −5.2 volt supply VEE. The transistor Q1 is maintained in an OFF condition. Transistor Q2 is biased ON by the VREF supply of −1.3 volts which is more positive then the −5.2 volt VEE supply. With transistor Q2 ON, collector current through the 245 ohm collector resistor develops a predetermined potential of approximately −0.8 volts at the base of Q4, thus causing Q4 to transmit a potential of −1.6 volts at its emitter considering that it has a one diode voltage drop appearing between its base and emitter. Transistor Q4 is biased ON thereby providing both collector and base current to the emitter of transistor Q2. Two 510 ohm resistors are connected, one each, to the conductors connected to the terminals VA and VB at one end and at the other end to a −2 volt power supply. Two luf capacitors are also connected, one each, between the conductors and ground. The emitter current of transistor Q4, flowing through the 510 ohm resistor, causes a voltage of −1.6 volts to appear at the terminal VB.

FIG. 2 is a chart which lists the voltage levels appearing at like designated locations on the circuit of FIG. 1. VIH corresponds to the "high" logic level of the signal appearing at the output of the CMOS logic circuit 12. VIL corresponds to the "low" logic level. In a like manner, the voltage levels VOH and VOL correspond to the "high" and "low" voltage levels on the output of $V_O$.

The use of the complementary outputs of the unused ECL logic NOR circuit to provide the voltages VA and VB is the ideal solution to the temperature tracking problem as VA and VB will automatically track the variations of the ECL output logic level as a function of temperature.

While there has been shown what is considered to be the preferred embodiment of the invention, it will be manifest that many changes and modifications may be made therein without departing from the essential spirit of the invention. It is intended, therefor, in the annexed claims, to cover all such changes and modifications as may fall within the true scope of the invention.

What is claimed is:

1. A temperature compensated CMOS to ECL interfacing circuit comprising:
   a CMOS circuit means for providing CMOS logic level output signals;
   an interfacing circuit means for receiving said CMOS logic level output signals and for translating said output signals to ECL logic level signals for application to serviced ECL circuits, said interfacing circuit means also having a pair of supply voltage terminals; and
   an ECL circuit means positioned in the same temperature environment as the serviced ECL circuits which receive the ECL logic level signals from said interfacing circuit means, said ECL circuit means coupled to said pair of supply voltage terminals of said interfacing circuit means to provide voltages the levels of which track temperature.

2. The temperature compensated CMOS to ECL interfacing circuit according to claim 1 wherein said interfacing circuit means is comprised of:
   a pair of supply voltage terminals each for receiving supply voltages; and
   a pair of complementary transistors having a common input and a common output for connecting one or the other of said supply voltage terminals to said common output as a function of the logic level of a CMOS signal applied to said common input.

3. The temperature compensated CMOS to ECL interfacing circuit according to claim 1 wherein said ECL circuit means is comprised of:
   a first and a second output connected, one each, to said pair of supply voltage terminals;
   a NOR gate having one input for coupling to a reference voltage for driving said NOR gate such that the output voltage level on said first output corresponds to a "low" ECL logic level and the output voltage level on said second output corresponds to a "high" ECL logic level.

4. The temperature compensated CMOS to ECL interfacing circuit according to claim 3 and further comprising:
   a terminal for coupling to a power source;
   a pair of resistors connecting said terminal to said pair of supply voltage terminals so as to provide power to said interfacing circuit means adequate to drive said serviced ECL circuits at voltage levels corresponding to the output voltage levels on said first and said second output of said NOR gate.

5. The temperature compensated CMOS to ECL interfacing circuit according to claim 4 and further comprising:
   a pair of capacitors connected between ground and said pair of supply voltage terminals.

6. A temperature compensated CMOS to ECL interfacing circuit comprising:
   an interfacing circuit means for receiving, at an input, CMOS logic level signals, and for translating said CMOS logic level signals to ECL logic level signals for application to serviced ECL circuits, said interfacing means having a pair of supply voltage terminals for receiving supply voltages, with variations in the supply voltage causing like variations in said ECL logic level signals; and an ECL circuit means positioned in the same temperature environment as the serviced ECL circuits which receive the ECL logic level signals from said interfacing circuit means, said ECL circuit means coupled to said pair of supply voltage terminals of said interfacing circuit means for providing voltages the levels of which track temperature.

7. The temperature compensated CMOS to ECL interfacing circuit according to claim 6 wherein said interfacing circuit means is comprised of:
- a pair of supply voltage terminals each for receiving supply voltages; and
- a pair of complementary transistors having a common input and a common output for connecting one or the other of said supply voltage terminals to said common output as a function of the logic level of a CMOS signal applied to said common input.

8. The temperature compensated CMOS to ECL interfacing circuit according to claim 6 wherein said ECL circuit means is comprised of:
- a first and a second output connected, one each, to said pair of supply voltage terminals;
- a NOR gate having one input for coupling to a reference voltage for driving said NOR gate such that the output voltage level on said first output corresponds to a "low" ECL logic level and the output voltage level on said second output corresponds to a "high" ECL logic level.

9. The temperature compensated CMOS to ECL interfacing circuit according to claim 8 and further comprising:
- a terminal for coupling to a power source;
- a pair of resistors connecting said terminal to said pair of supply voltage terminals so as to provide power to said interfacing circuit means adequate to drive said serviced ECL circuits at voltage levels corresponding to the output voltage levels on said first and said second output of said NOR gate.

10. The temperature compensated CMOS to ECL interfacing circuit according to claim 9 and further comprising:
- a pair of capacitors connected between ground and said pair of supply voltage terminals.

* * * * *